US012604466B2

(12) United States Patent
Tsai

(10) Patent No.: US 12,604,466 B2
(45) Date of Patent: Apr. 14, 2026

(54) SEMICONDUCTOR DEVICE AND MANUFACTURING METHOD THEREOF

(71) Applicant: NANYA TECHNOLOGY CORPORATION, New Taipei City (TW)

(72) Inventor: Sheng Chieh Tsai, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 454 days.

(21) Appl. No.: 18/171,662

(22) Filed: Feb. 21, 2023

(65) Prior Publication Data

US 2024/0284661 A1     Aug. 22, 2024

(51) Int. Cl.
*H01L 21/78*      (2006.01)
*H10B 12/00*      (2023.01)

(52) U.S. Cl.
CPC .......... *H10B 12/488* (2023.02); *H10B 12/02* (2023.02); *H10B 12/485* (2023.02); *H10B 12/053* (2023.02); *H10B 12/30* (2023.02)

(58) Field of Classification Search
CPC .... H10B 12/488; H10B 12/02; H10B 12/485; H10B 12/053; H10B 12/30
USPC ....................................................... 257/295
See application file for complete search history.

(56) References Cited

U.S. PATENT DOCUMENTS

| | | | | |
|---|---|---|---|---|
| 7,572,572 B2 * | 8/2009 | Wells | ................. | H10N 70/8845 |
| | | | | 430/311 |
| 7,696,101 B2 * | 4/2010 | Li | ........................ | H01L 21/3086 |
| | | | | 257/E21.038 |
| 8,309,460 B2 * | 11/2012 | Kim | .................... | H01L 21/0337 |
| | | | | 438/668 |
| 8,835,321 B2 * | 9/2014 | Ha | ......................... | H10B 41/35 |
| | | | | 438/697 |
| 9,911,605 B2 * | 3/2018 | Heo | .................. | H01L 21/31058 |
| 10,366,889 B2 * | 7/2019 | Chang | ............... | H01L 21/32139 |
| 10,763,262 B2 * | 9/2020 | Shih | ..................... | H10B 12/315 |
| 11,792,973 B2 * | 10/2023 | Huang | ................. | H10B 12/053 |
| | | | | 257/296 |
| 12,165,874 B2 * | 12/2024 | Lu | .......................... | H10B 12/02 |
| 2020/0168615 A1 | 5/2020 | Shih | | |
| 2023/0180465 A1 * | 6/2023 | Yu | ....................... | H01L 21/3086 |
| | | | | 257/296 |

* cited by examiner

*Primary Examiner* — Vu A Vu
(74) *Attorney, Agent, or Firm* — CKC & Partners Co., LLC

(57) ABSTRACT

The manufacturing method of a semiconductor device includes providing a word line structure and a hard mask stack on the word line structure. The word line structure includes an active area, a word line, an isolation structure and a protection layer, the word line covers a portion of the active area, the isolation structure is adjacent to the active area and the word line, and the protection layer covers the active area, the word line, and the isolation structure. A first photolithography process is performed to etch the hard mask stack by using a photomask along a first direction. A second photolithography process is performed to etch the hard mask stack by using a photomask along a second direction. A protection pillar covering the portion of the active area by etching the protection layer is formed by using the hard mask stack as a mask.

14 Claims, 14 Drawing Sheets

<u>100</u>

SEMICONDUCTOR DEVICE AND MANUFACTURING METHOD THEREOF

BACKGROUND

Field of Disclosure

The present disclosure relates to a semiconductor device and a manufacturing method thereof.

Description of Related Art

A memory structure includes several capacitors and transistors arranged in an array. A word line connected with transistors is able to turn on or turn off the transistors. If the transistors ore on, the transistor may connect with the capacitor to charge or discharge the capacitor, and data may be written or read by a bitline connected to the transistors.

SUMMARY

Some embodiments of the present disclosure provides a manufacturing method of a semiconductor device includes providing a word line structure and a hard mask stack on the word line structure, wherein the word line structure includes an active area, a word line, an isolation structure and a protection layer, the word line is adjacent to the active area and covers a first portion of the active area, the isolation structure is adjacent to the active area and the word line, and the protection layer covers the active area, the word line, and the isolation structure. A first photolithography process is performed to etch the hard mask stack by using a first photomask, wherein the first photomask is along a first direction. A second photolithography process is performed to etch the hard mask stack by using a second photomask, wherein the second photomask is along a second direction, and the second direction is different from the first direction. A protection pillar covering the word line and the first portion of the active area by etching the protection layer is formed by using the hard mask stack as a mask.

In some embodiments, an angle between the first direction and the second direction is between 30 degrees and 60 degrees.

In some embodiments, the protection pillar is rhombus-shaped.

In some embodiments, performing the first photolithography process includes forming a first patterned photoresist layer on the hard mask stack by using the first photomask, forming first spacers at sidewalls of the first patterned photoresist layer, removing the first patterned photoresist layer, and etching the hard mask stack by using the first spacers.

In some embodiments, forming the first spacers at the sidewalls of the first patterned photoresist layer includes forming a first blanket layer covering the first patterned photoresist layer and the hard mask stack, partially etching the first blanket layer to remove the first blanket layer directly on the first patterned photoresist layer and the hard mask stack. The first blanket layer at the sidewalls of the first patterned photoresist layer remains and become the first spacers.

In some embodiments, performing the first photolithography process includes controlling a width of the first spacers.

In some embodiments, the first patterned photoresist layer is etched and trimmed after forming a first patterned photoresist layer on the hard mask stack.

In some embodiments, wherein performing the second photolithography process includes forming the second patterned photoresist layer on the hard mask stack by using the second photomask, forming second spacers at sidewalls of the second patterned photoresist layer, removing the second patterned photoresist layer, and etching the hard mask stack by using the second spacers.

In some embodiments, forming the second spacers at the sidewalls of the second patterned photoresist layer includes forming a second blanket layer covering the second patterned photoresist layer and the hard mask stack, and partially etching the second blanket layer to remove the second blanket layer directly on the second patterned photoresist layer and the hard mask stack. The second blanket layer at the sidewalls of the second patterned photoresist layer remains and become the second spacers.

In some embodiments, performing a second photolithography process includes controlling a width of the second spacers.

In some embodiments, the protection pillar further covers isolation structure.

Some embodiments of the present disclosure provides a manufacturing method of a semiconductor device includes providing a word line structure and a hard mask stack on the word line structure, wherein the word line structure comprises active areas, word lines, isolation structures and a protection layer, each of the active areas is sandwiched by the word lines, a first portion of each of the active areas is covered by the word lines, each of the isolation structures is sandwiched by the word lines, and the protection layer covers the active areas, the word lines, and the isolation structures. A first photolithography process is performed to etch the hard mask stack by using a first photomask, wherein the first photomask is along a first direction. A second photolithography process to etch the hard mask stack by using a second photomask, wherein the second photomask is along a second direction, and the second direction is different from the first direction. Protection pillars covering the word lines and the isolation structures are formed by etching the protection layer by using the hard mask stack as a mask, wherein the protection pillars cover the first portion of each of the active areas, and a second portion of each of the active areas is exposed.

In some embodiments, each of the protection pillars extends from one of the word lines to another of the word lines.

In some embodiments, the manufacturing method of claim includes forming bitline contacts on the active areas after forming the protection pillars, and forming bitlines on the bitline contacts.

In some embodiments, the first photolithography process defines a first sidewall and a second sidewall of each of the protection pillars, the second photolithography process defines a third sidewall and a fourth sidewall of each of the protection pillars, the first sidewall is opposite to the second sidewall, the third sidewall is opposite to the fourth sidewall, and the third sidewall is adjacent to the first sidewall.

Some embodiments of the present disclosure provides a semiconductor device includes two active areas, an isolation structure between the active areas, two word lines, and protection pillars covering the word lines. Each of the word lines is between one of the active areas and the isolation structure, and the protection pillars are rhombus-shaped.

In some embodiments, each of the protection pillars extends from one of the word lines to another of the word lines.

In some embodiments, first portions of the active areas are under the word lines.

In some embodiments, each of the protection pillars extends from one of the active areas to another of the active areas.

In some embodiments, the first portions of each of the active areas are covered by two of the protection pillars.

Some embodiments of the present disclosure are related to a manufacturing method of protection pillars in a semiconductor device. The protection pillars are used to protect the word lines active areas under the word lines. The shape of the protection pillars are determined by two different photolithography processes. Therefore the parameters of the shape of the protection pillars may be individually tuned, and the local critical dimension uniformity (CDU) problem of the protection pillars may be reduced. Also, the protection pillars used for protecting the active areas are enlarged.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
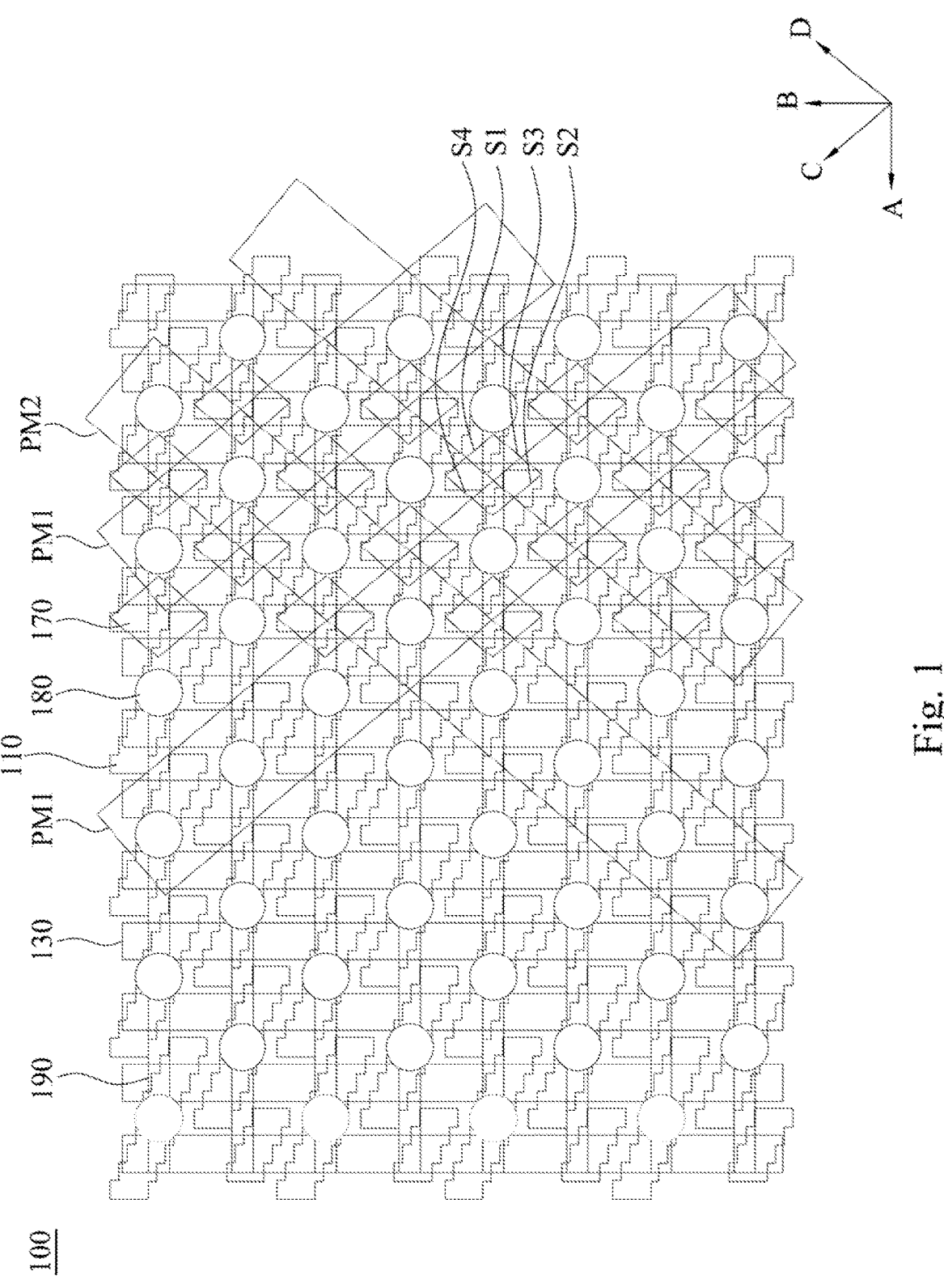
FIG. 1 illustrates a top view of a semiconductor device in some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Some embodiments of the present disclosure are related to a manufacturing method of protection pillars in a semiconductor device. The protection pillars are used to protect the word lines active areas under the word lines. The shape of the protection pillars are determined by two different photolithography processes. Therefore the parameters of the shape of the protection pillars may be individually tuned, and the local critical dimension uniformity (CDU) problem of the protection pillars may be reduced. Also, the protection pillars used for protecting the active areas are enlarged.

FIG. 1 illustrates a top view of a semiconductor device 100 in some embodiments of the present disclosure. The semiconductor device 100 includes active areas 110, word lines 130, bitlines 190 and bitline contacts 180. The word lines 130 are along a direction B and the bitlines 190 are along the direction A, and the direction A and the direction B are perpendicular to each other. The bitlines 190 and the word lines 130 are formed in different layers. In some embodiments, the bitlines 190 are above the word lines. The active areas 110 are below the word lines 130, and a portion of the active areas 110 is covered by the word lines 130. The protection pillars 170 covers the word lines 130, and the protection pillars 170 are rhombus-shaped. The protection pillars 170 are used to protect the word lines 130. Therefore, each of the protection pillars 170 extends from one of the word lines 130 to another of the word lines 130. In some embodiments, the protection pillar 170 extends from one of the active areas 110 to another of the active areas 110. That is, each of the active areas 110 are covered by two of the protection pillars 170. The protection pillars 170 in the present disclosure are rhombus-shaped, and the shapes of the protection pillars 170 are defined by the first photomask PM1 and the second photomask PM2.

The first photomask PM1 is along a first direction C, and the second photomask PM2 is along a second direction D. In some embodiments, an acute angle between the first direction C and the second direction D is between 30 degrees and 60 degrees. Since the protection pillars 170 are formed by using two different types of photomasks (i.e. two different photolithology processes), the parameters may be more precisely tuned during each of the photolithology processes, and the local critical dimension uniformity (CDU) problem of the protection pillars 170 may be reduced. The bitline contacts 180 are at the same level of the protection pillars 170 and are on the active areas 110. The bitline contacts 180 are used to provide the connection between the active areas 110 and the bitlines 190.

Figure 2:
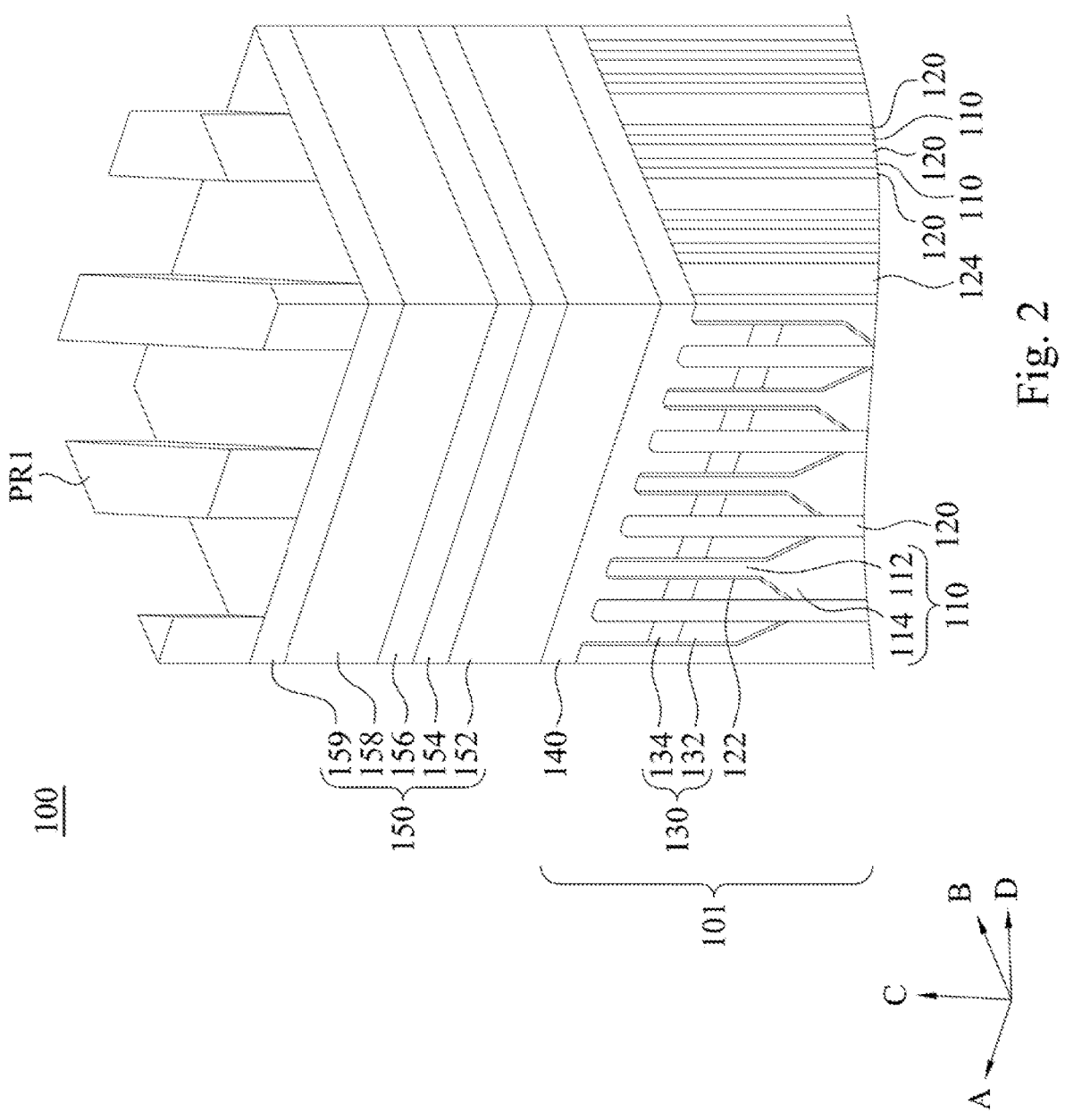
FIGS. 2-12 illustrate perspective views of a manufacturing method of protection pillars of a semiconductor device.

FIGS. 2-12 illustrate perspective views of a manufacturing method of protection pillars of a semiconductor device 100. Referring to FIG. 2, a word line structure 101 and a hard mask stack 150 on the word line structure 101 are provided. The word line structure 101 includes active area 110, word lines 130, isolation structures 120 and a protection layer 140. The word line 130 is adjacent to the active area 110 and covers a first portion 114 of the active area 110. The active area 110 further includes a second portion 112 not covered by the word line 130. That is, the word line 130 covers a portion of the active area 110. The isolation structure 120 is adjacent to the active area 110 and the word line 130, and the protection layer 140 covers the active area 110, the word line 130, and the isolation structure 120. More particularly, in the direction A, the active areas 110 and the word lines 130 are arranged alternatively. The bottom portion of the active areas 110 are in contact with the isolation structures 120, and the top portion of the active areas 110 and the isolation structures 120 are separated by the word lines 130. The word lines 130 are along the direction B. In some embodiments, each of the word lines 130 includes a first portion 132 and a second portion 134 on the first portion 132. The first portion 132 and the second portion 134 of the word line 130 may be made of different materials. For example, the first portion 132 is made of metal layer, and the second portion 134 is made of poly silicon layer. In some embodiments, an insulation layer 122 is between the word line 130 and the active area 110. In direction B, the active areas 110 and the isolation structures 120 are also alternatively arranged, and isolation structures 124 are formed between the isolation structures 120. The protection layer 140 covers the active areas 110, the word lines 130, and the isolation structures 120, and a portion of the protection layer 140 is between the active areas 110 and the isolation structures 120. In some embodiments, the active areas 110 are made of silicon, the isolation structures 120 and insulation layers 122 are made of oxide, and the protection layer 140 and the isolation structures 124 are made of nitrides.

The hard mask stack 150 is formed on the word line structure 101. In some embodiments, the hard mask stack 150 includes an underlayer 152, anti-reflective coating layer 154, an oxide layer 156, a carbon layer 158 and a hard mask 159. After forming the hard mask stack 150, a first photolithography process is performed to etch the hard mask stack 150 by using a first photomask PM1 (as shown in FIG. 1), and the first photomask PM1 is along the first direction C. FIGS. 2-6 illustrate the steps of the first photolithography process. Referring to FIG. 2, a first patterned photoresist layer PR1 is formed on the hard mask stack 150 by using the first photomask PM1. Forming the first patterned photoresist layer PR1 may include first coating a photoresist material on the hard mask stack 150, and the photoresist material is exposed by using the first photomask PM1, then the photoresist material is deposited to form the first patterned photoresist layer PR1 along the first direction C.

Figure 3:
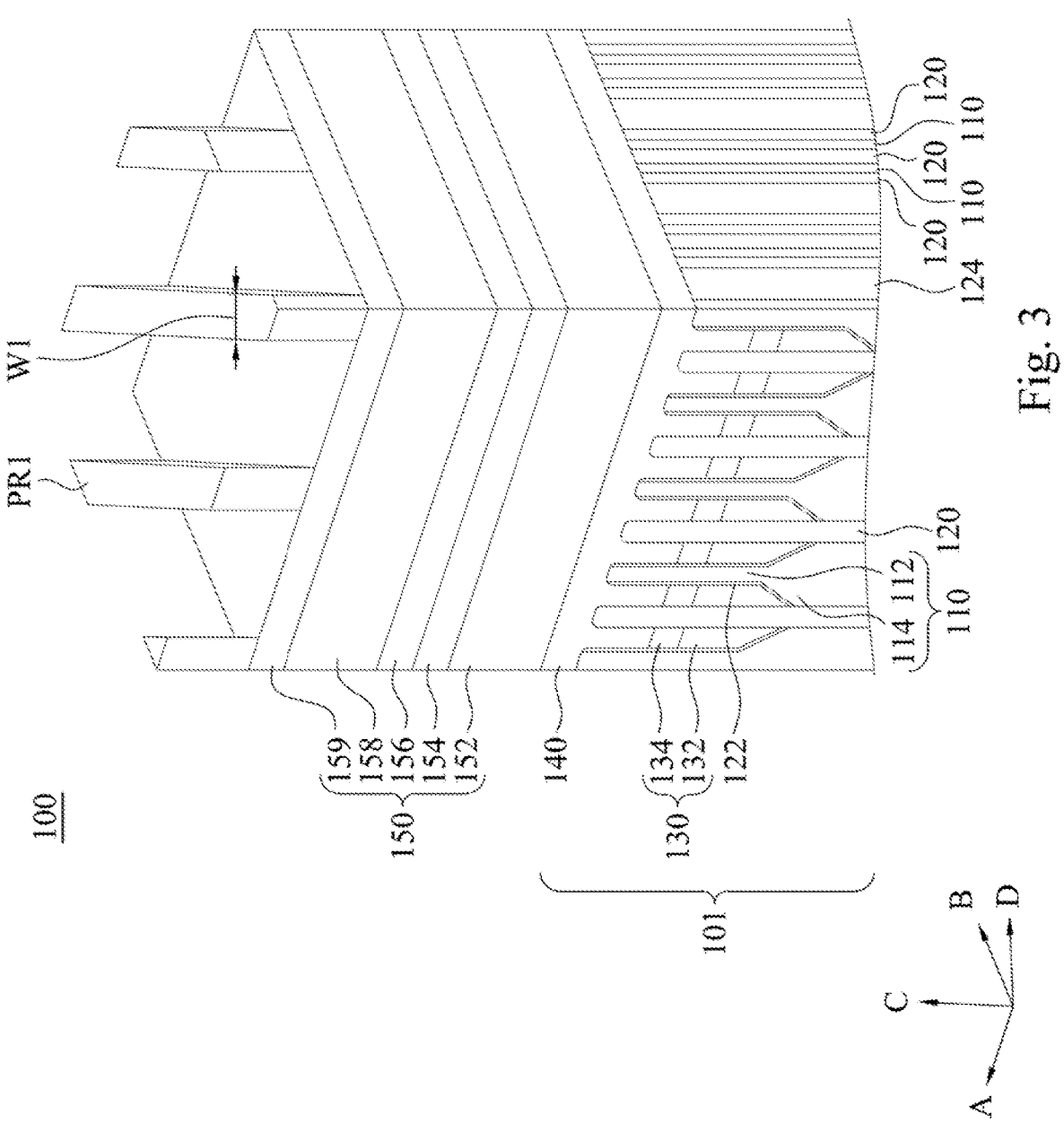

Referring to FIG. 3, the first patterned photoresist layer PR1 is etched and trimmed, so that the width W1 of the first patterned photoresist layer PR1 is controlled. More particularly, since the etching process in FIG. 3 is able to achieve better resolution, the etching process in FIG. 3 is used to trim the first patterned photoresist layer PR1. The width of the first patterned photoresist layer PR1 decreases to the width W1 after the etching process in FIG. 3. In some embodiments, the width W1 is determined by the distance between different active areas 110. In some embodiments, the width W1 is in a range of 30 to 40 nm.

Figure 4:
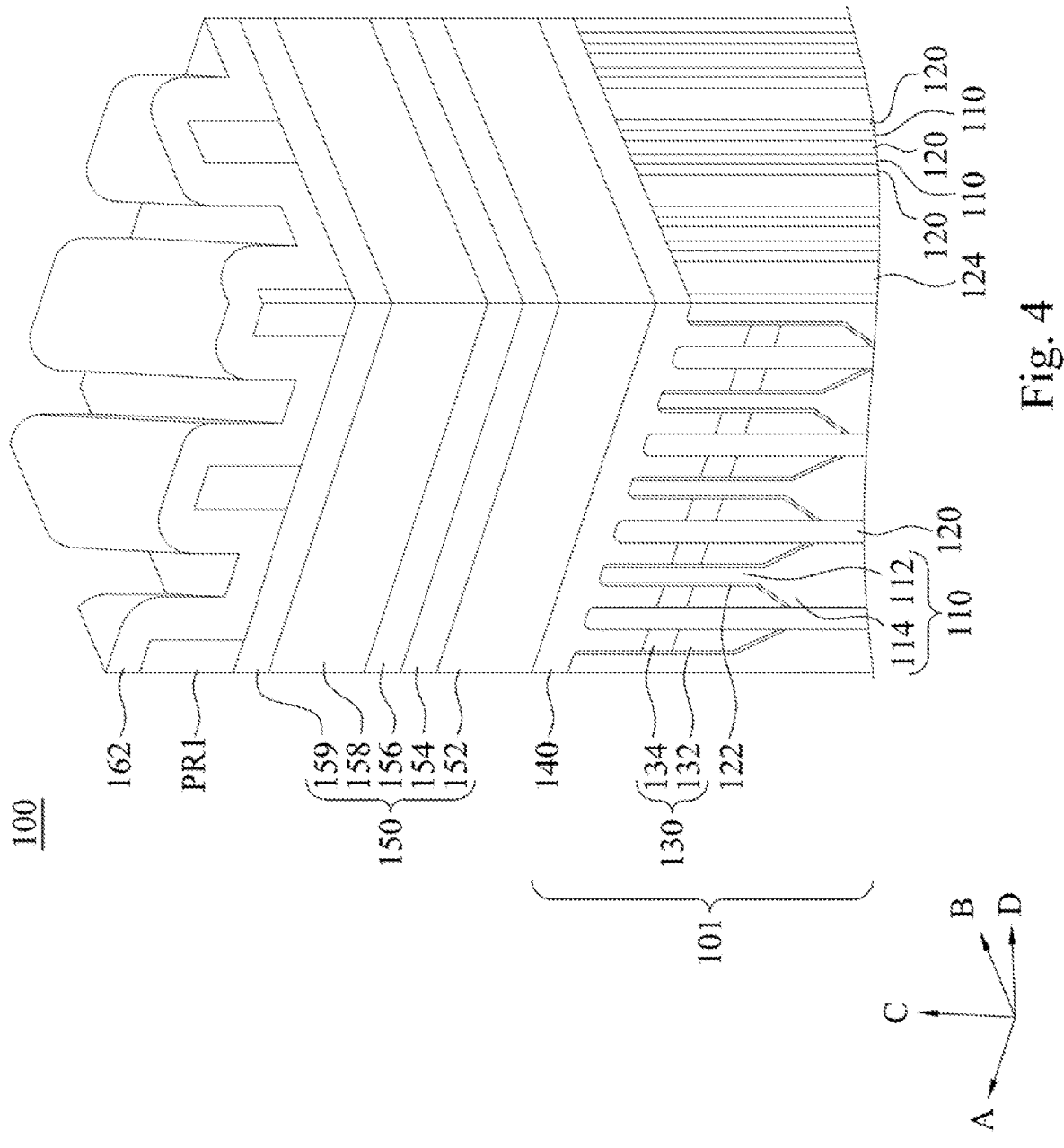

Referring to FIG. 4, a first blanket layer 162 covering the first patterned photoresist layer PR1 and the hard mask stack 150 is formed. More particularly, the first blanket layer 162 covers the top surfaces, the sidewalls of the first patterned photoresist layer PR1 and the exposed surface of the hard mask stack 150. In some embodiments, the first blanket layer 162 is made of material different from the upmost layer of the hard mask stack 150 (such as the hard mask 159). In some embodiments, the first blanket layer 162 is made of oxide.

Figure 5:
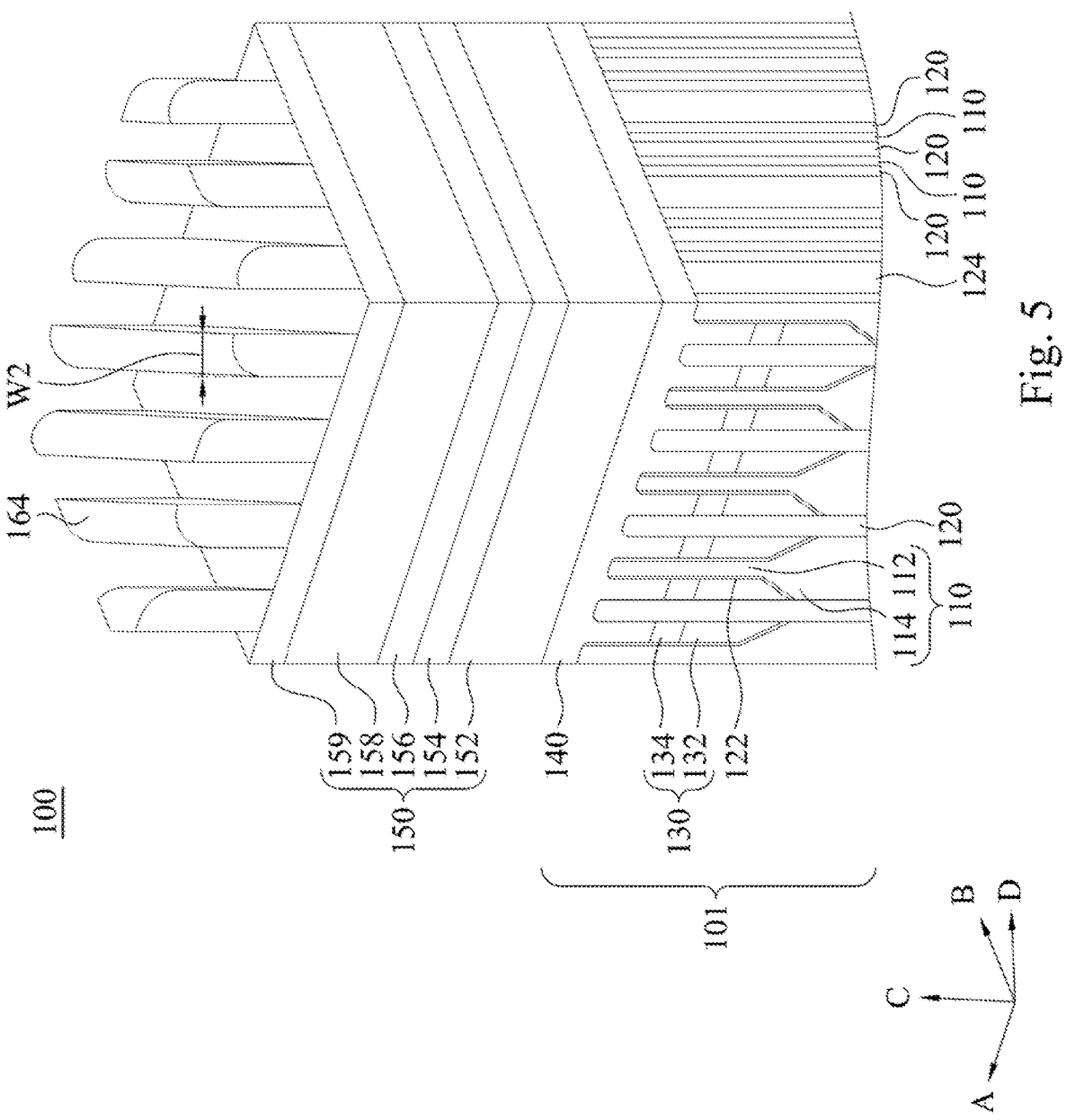

Referring to FIG. 5, first spacers 164 are formed at the sidewalls of the first patterned photoresist layer PR1, and the first patterned photoresist layer PR1 is removed. More particularly, the first blanket layer 162 is partially etched to remove the first blanket layer 162 directly on the first patterned photoresist layer PR1 and the hard mask stack 150, and the first blanket layer 162 at the sidewalls of the first patterned photoresist layer PR1 remains and become the first spacers 164. Since the first patterned photoresist layer PR1 is exposed, the first patterned photoresist layer PR1 is able to be removed. During partially etching the first blanket layer 162 to form the first spacers 164, the width W2 of the first spacers 164 is controlled. In some embodiments, the width W2 is determined by range of the first portions 114 of the active areas 110. For example, the projection of the first spacers 164 to the word line structure 101overlaps and covers the word lines 130, the first portion 114 of the active areas 110 covered by the word lines 130 are also covered by the first spacers 164. In some other embodiments, the width W2 of the first spacers 164 is same as the thickness of the first blanket layer 162, so the width W2 of the first spacers 164 has been already determined in FIG. 4. In some embodiments, the width W1 is in a range of 30 to 40 nm.

Referring to FIG. 5, the hard mask stack 150 is etched by using the first spacers 164. In some embodiments, the hard mask 159 is first etched by using the first spacers 164 as the mask. Subsequently, the carbon layer 158 is etched by using the hard mask 159 as the mask. Subsequently, the oxide layer 156 is etched by using the carbon layer 158 as the mask. After the oxide layer 156 is etched, the oxide layer 156 becomes the patterned oxide layer 156A. The patterned oxide layer 156 includes stripe-shaped layer along the first direction C.

Figure 6:
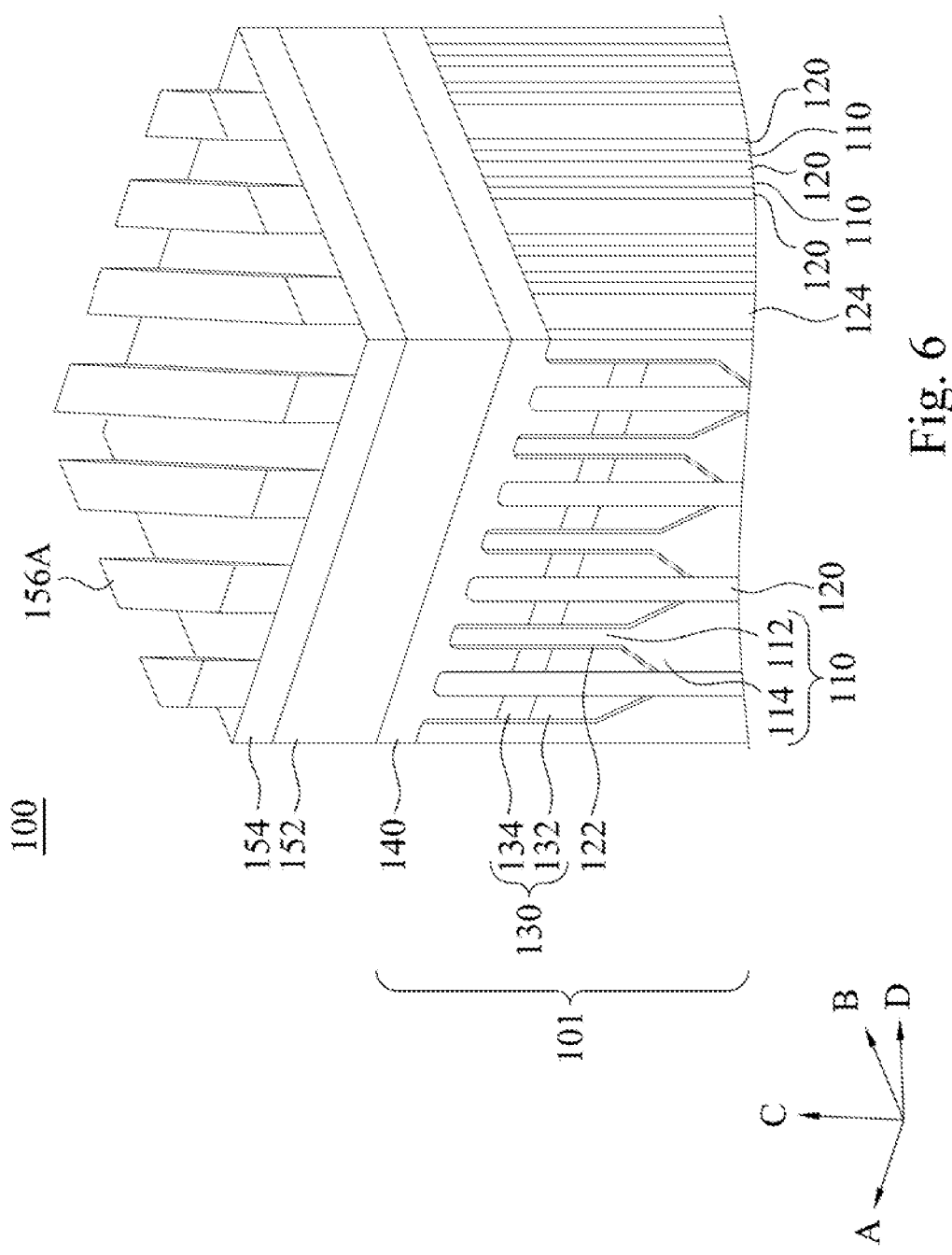
Figure 7:
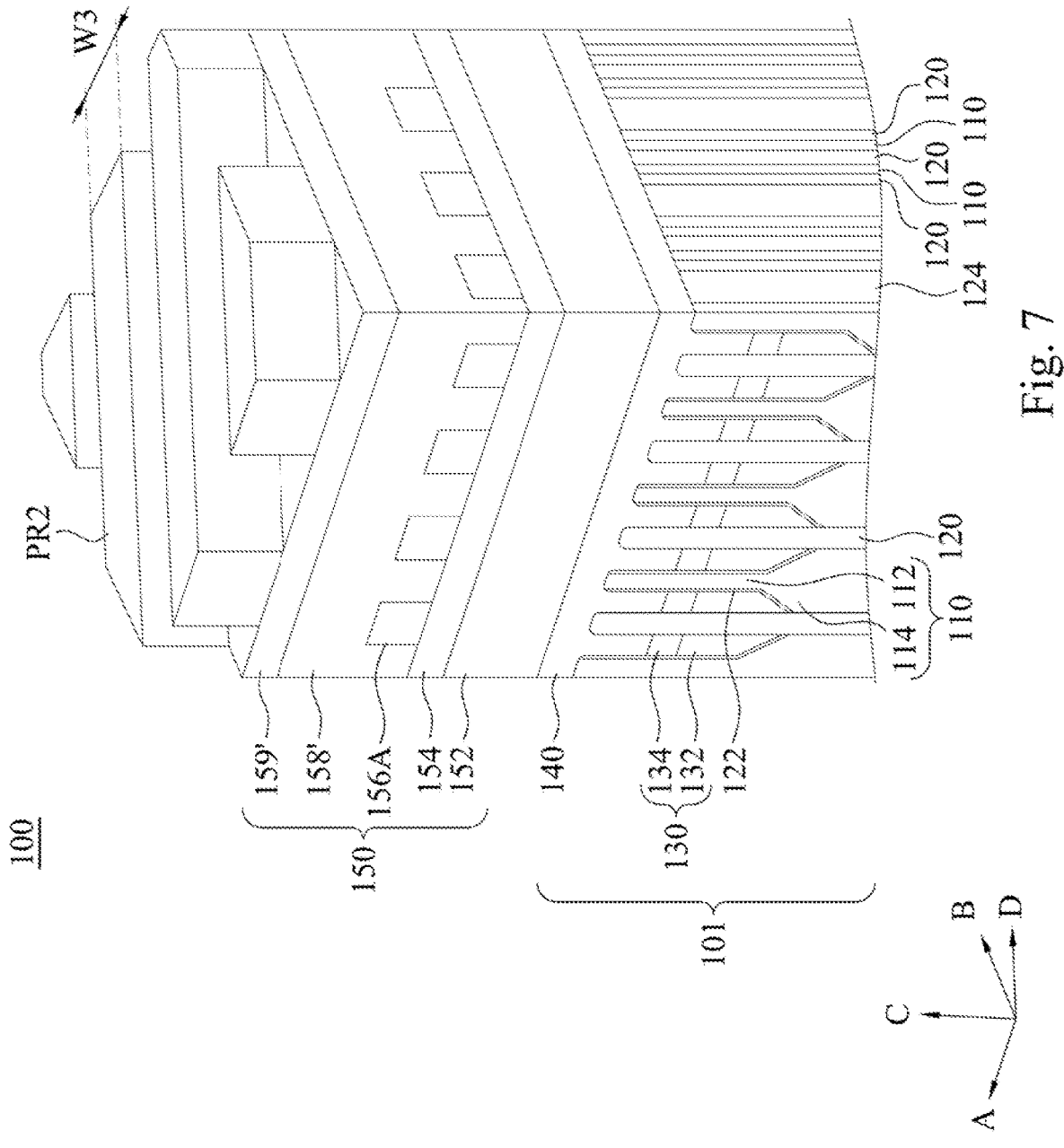

After performing the first photolithography process, a second photolithography process is performed to etch the hard mask stack 150 by using a second photomask PM2 (as shown in FIG. 1). The second photomask PM2 is along the second direction D, and the second direction D is different from the first direction C. FIGS. 6-10 illustrate the steps of the second photolithography process. Referring to FIG. 6, a carbon layer 158' and a hard mask 159' are sequentially formed on the patterned oxide layer 156A. The details of the carbon layer 158' and the hard mask 159' are same as the details of the carbon layer 158 and a hard mask 159 in FIGS. 2-6. A second patterned photoresist layer PR2 is formed on the hard mask stack 150 by using the second photomask PM2. Forming the second patterned photoresist layer PR2 may include first coating a photoresist material on the hard mask stack 150, and the photoresist material is exposed by using the second photomask PM2, then the photoresist material is deposited to form the second patterned photoresist layer PR2 along the second direction D.

Figure 8:
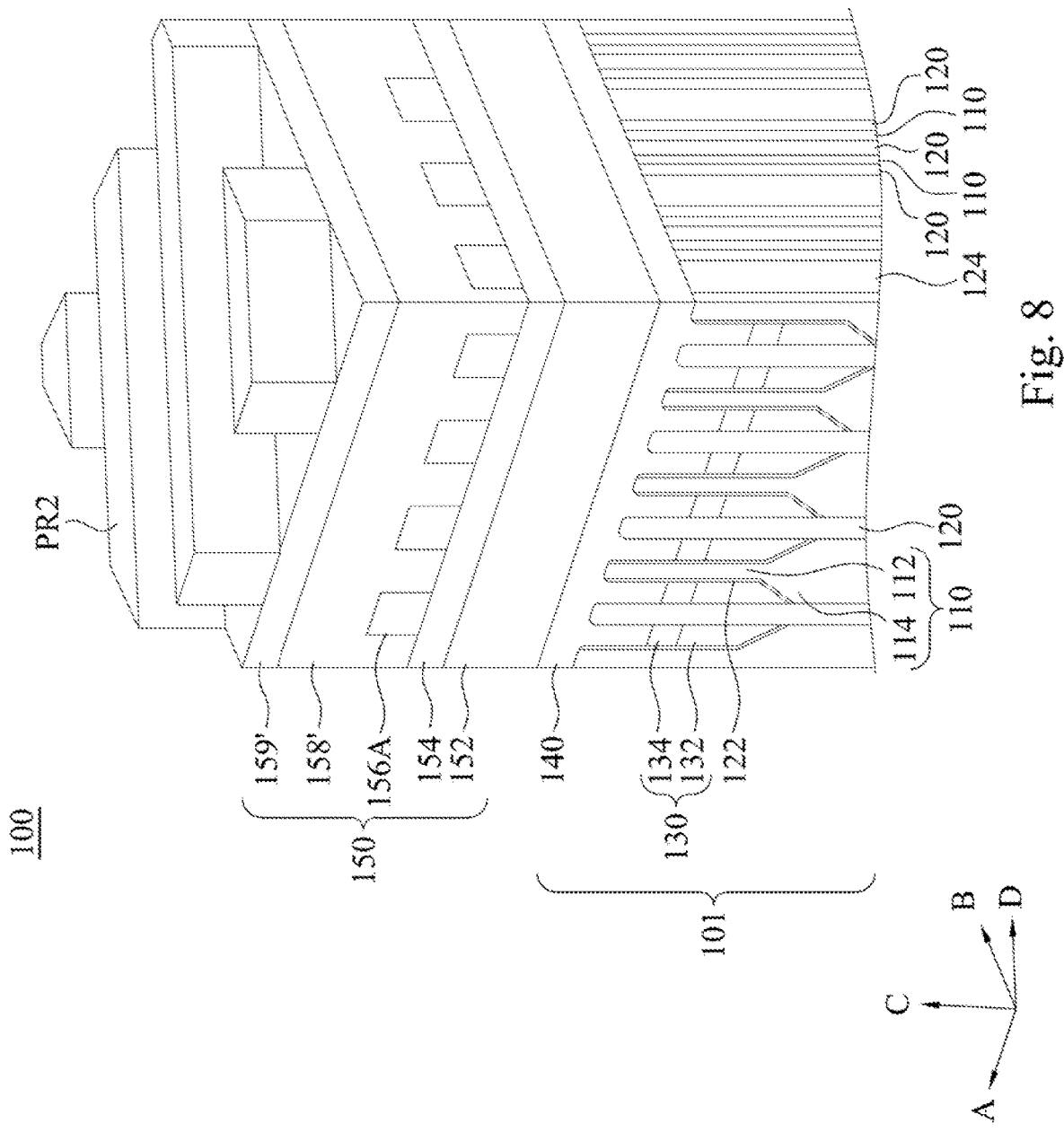

Referring to FIG. 8, the second patterned photoresist layer PR2 is etched and trimmed, so that the width W3 of the second patterned photoresist layer PR2 is controlled. More particularly, since the etching process in FIG. 8 is able to achieve better resolution, the etching process in FIG. 8 is used to trim the second patterned photoresist layer PR2. The width of the second patterned photoresist layer PR2 decreases to the width W3 after the etching process in FIG. 8. In some embodiments, the width W3 is determined by the distance between different active areas 110. In some embodiments, the width W3 is in a range of 30 to 40 nm.

Figure 9:
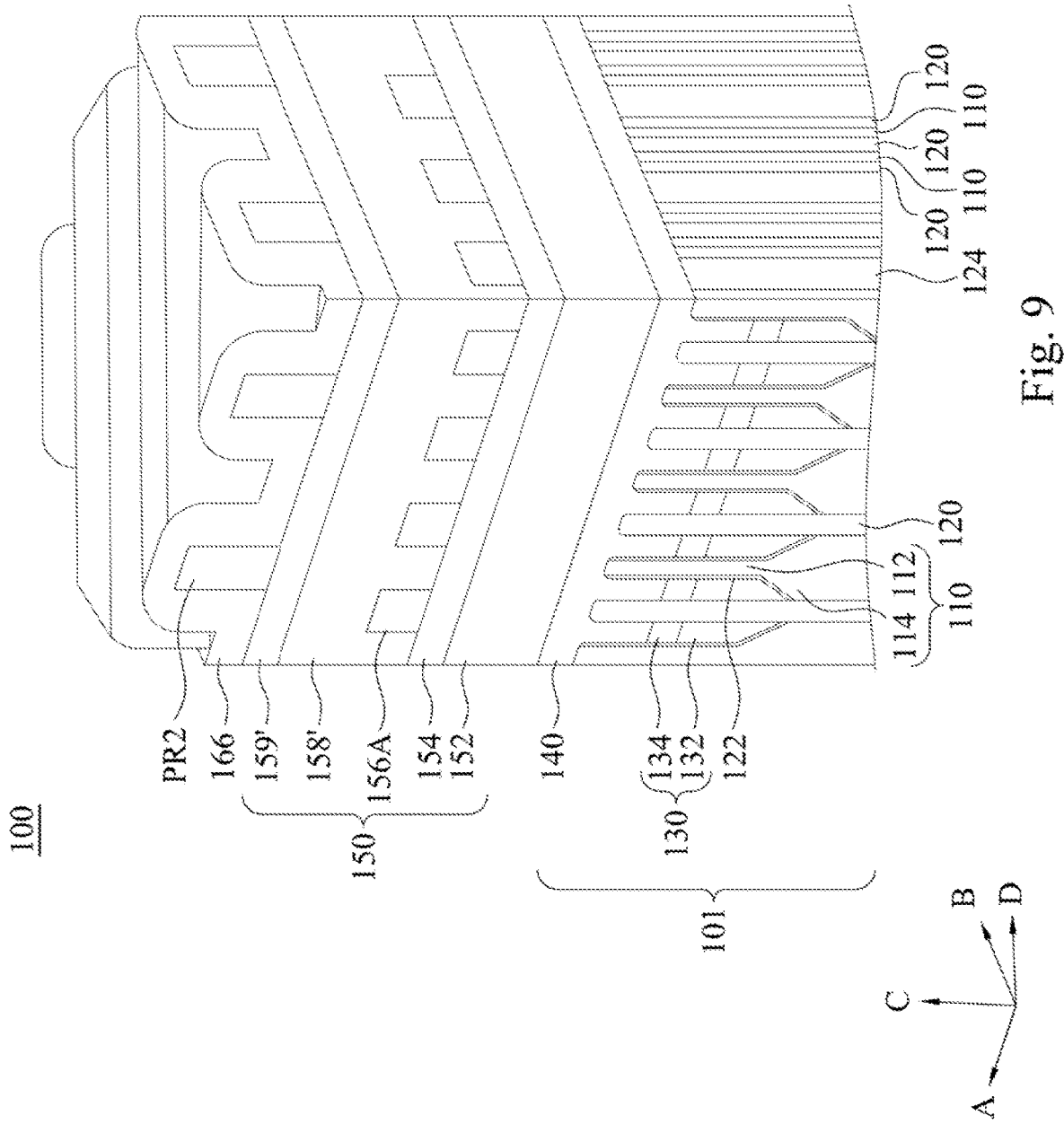

Referring to FIG. 9, a second blanket layer 166 covering the first second patterned photoresist layer PR2 and the hard mask stack 150 is formed. More particularly, the second blanket layer 166 covers the top surfaces, the sidewalls of the second patterned photoresist layer PR2 and the exposed surface of the hard mask stack 150. In some embodiments, the second blanket layer 166 is made of material different from the upmost layer of the hard mask stack 150 (such as the hard mask 159). In some embodiments, the second blanket layer 166 is made of oxide.

Figure 10:
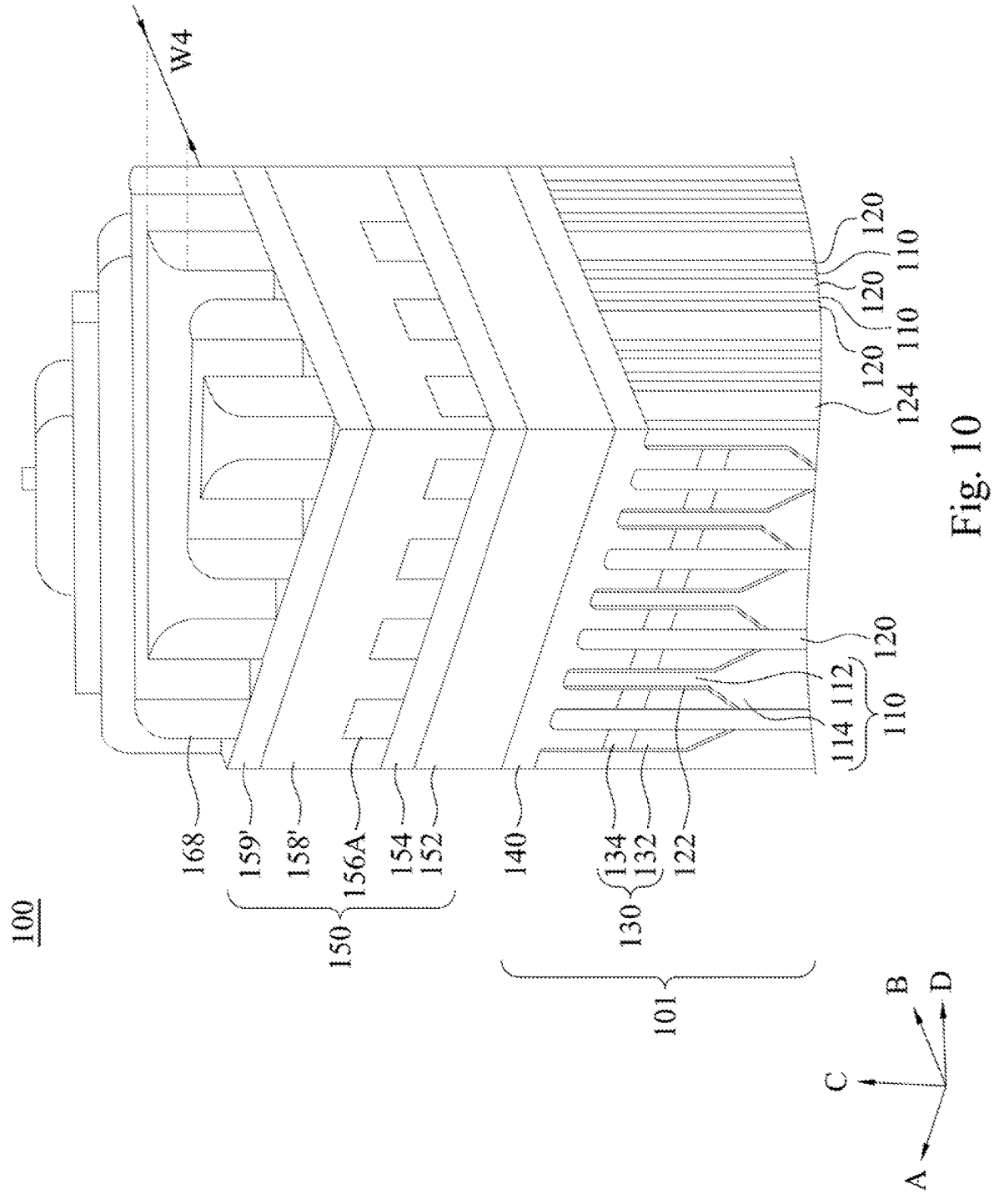

Referring to FIG. 10, second spacers 168 are formed at the sidewalls of the second patterned photoresist layer PR2, and the second patterned photoresist layer PR2 is removed. More particularly, the second blanket layer 166 is partially etched to remove the second blanket layer 166 directly on the second patterned photoresist layer PR2 and the hard mask stack 150, and the second blanket layer 166 at the sidewalls of the second patterned photoresist layer PR2 remains and become the second spacers 168. Since the second patterned photoresist layer PR2 is exposed, the second patterned photoresist layer PR2 is able to be removed. During partially etching the second blanket layer 166 to form the second spacers 168, the width W4 of the second spacers 168 is controlled. In some embodiments, the width W4 is determined by range of the first portions 114 of the active areas 110. For example, the projection of the second spacers 168 to the word line structure 101 overlaps and covers the word lines 130, the first portion 114 of the active areas 110 covered by the word lines 130 are also covered by the second spacers 168. In some other embodiments, the width W4 of the second spacers 168 is same as the thickness of the second blanket layer 166, so the width W4 of the second spacers 168 has been already determined in FIG. 9.

Figure 11:
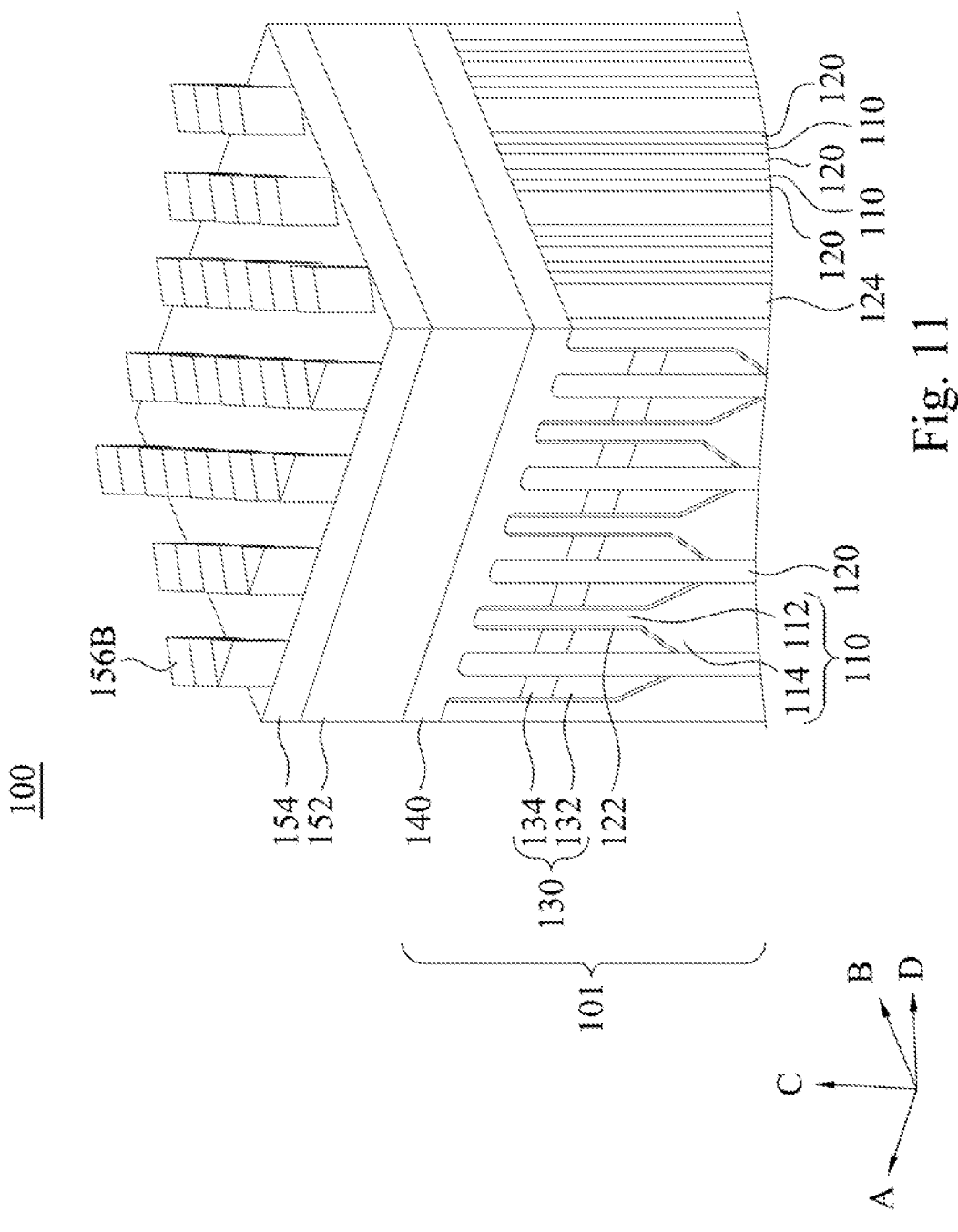

Referring to FIG. 11, the hard mask stack 150 is etched by using the second spacers 168. In some embodiments, the hard mask 159 is first etched by using the second spacers 168 as the mask. Subsequently, the carbon layer 158 is etched by using the hard mask 159 as the mask. Subsequently, the patterned oxide layer 156A is etched by using the carbon layer 158 as the mask. After the patterned oxide layer 156A is etched, the patterned oxide layer 156A becomes the patterned oxide layer 156B. The patterned oxide layer 156 includes rhombus-shaped pillars arranged on the anti-reflective coating layer 154.

Figure 12:
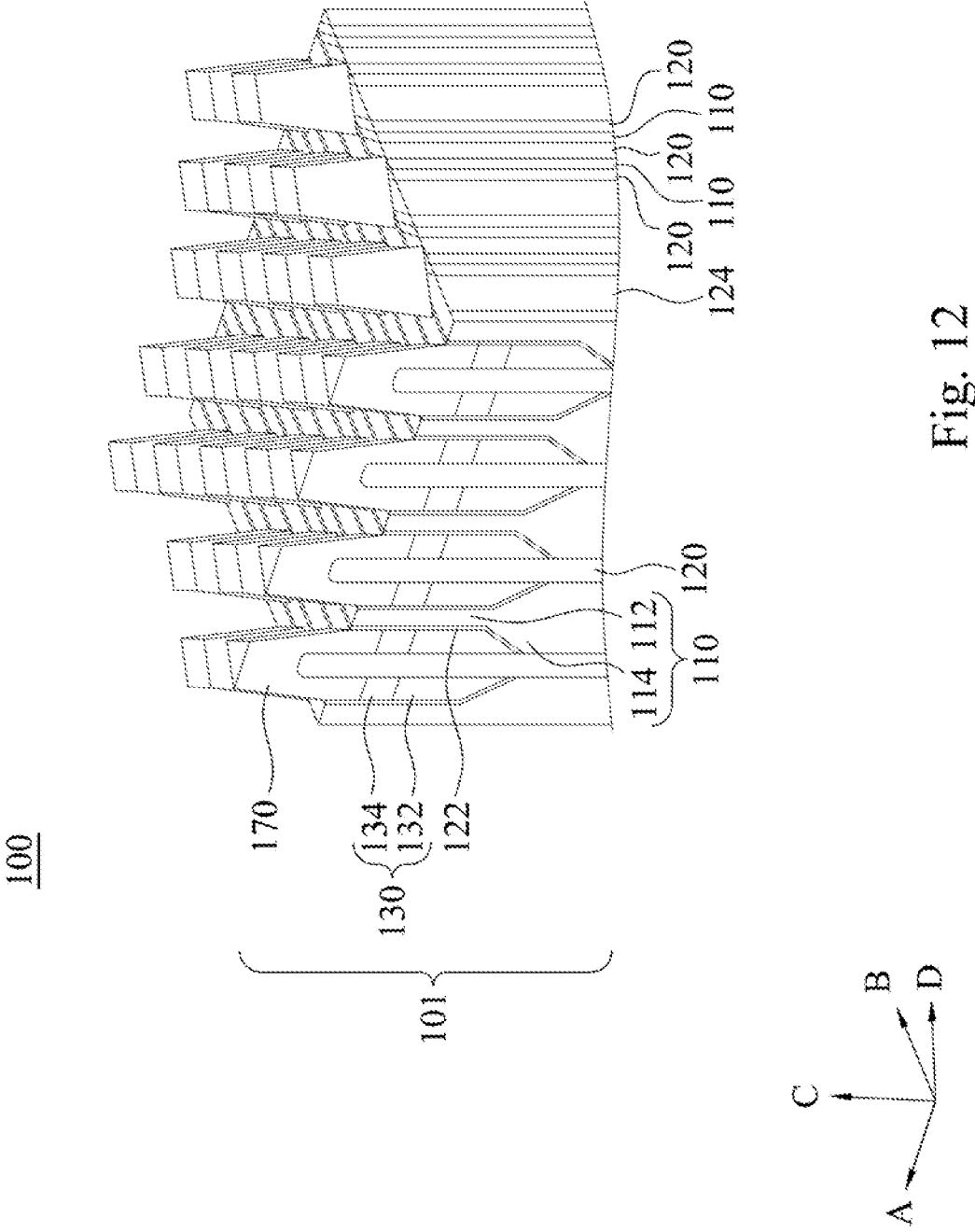

Referring to FIG. 12, the protection pillars 170 covering the word line 130 and the first portion 114 of the active area 110 are formed by etching the protection layer 140 by using the hard mask stack 150 as a mask, and the second portion 112 of the active areas 110 are exposed. The protection pillars 170 covers the word lines 130, and the protection pillars 170 further covers the isolation structure 120 and the first portion 114 of the the active area 110.

As such, the shape of the protection pillars 170 is defined by the first photolithography process and the second photolithography process. The first photolithography process defines a first sidewall S1 and a second sidewall S2 of each of the protection pillars 170. The second photolithography process defines a third sidewall S3 and a fourth sidewall S4 of each of the protection pillars 170. The first sidewall S1 is opposite to the second sidewall S2, the third sidewall S3 is opposite to the fourth sidewall S4, and the third sidewall S3 is adjacent to the first sidewall S1. The parameters of the shape of the protection pillars 170 may be individually tuned in the first photolithography process and the second photolithography process, and the local critical dimension uniformity (CDU) problem of the protection pillars may be reduced. Therefore, the first portion 114, which may be easily etched in subsequent processes, of the active area 110 are well-protected by the protection pillars 170.

Figure 13:
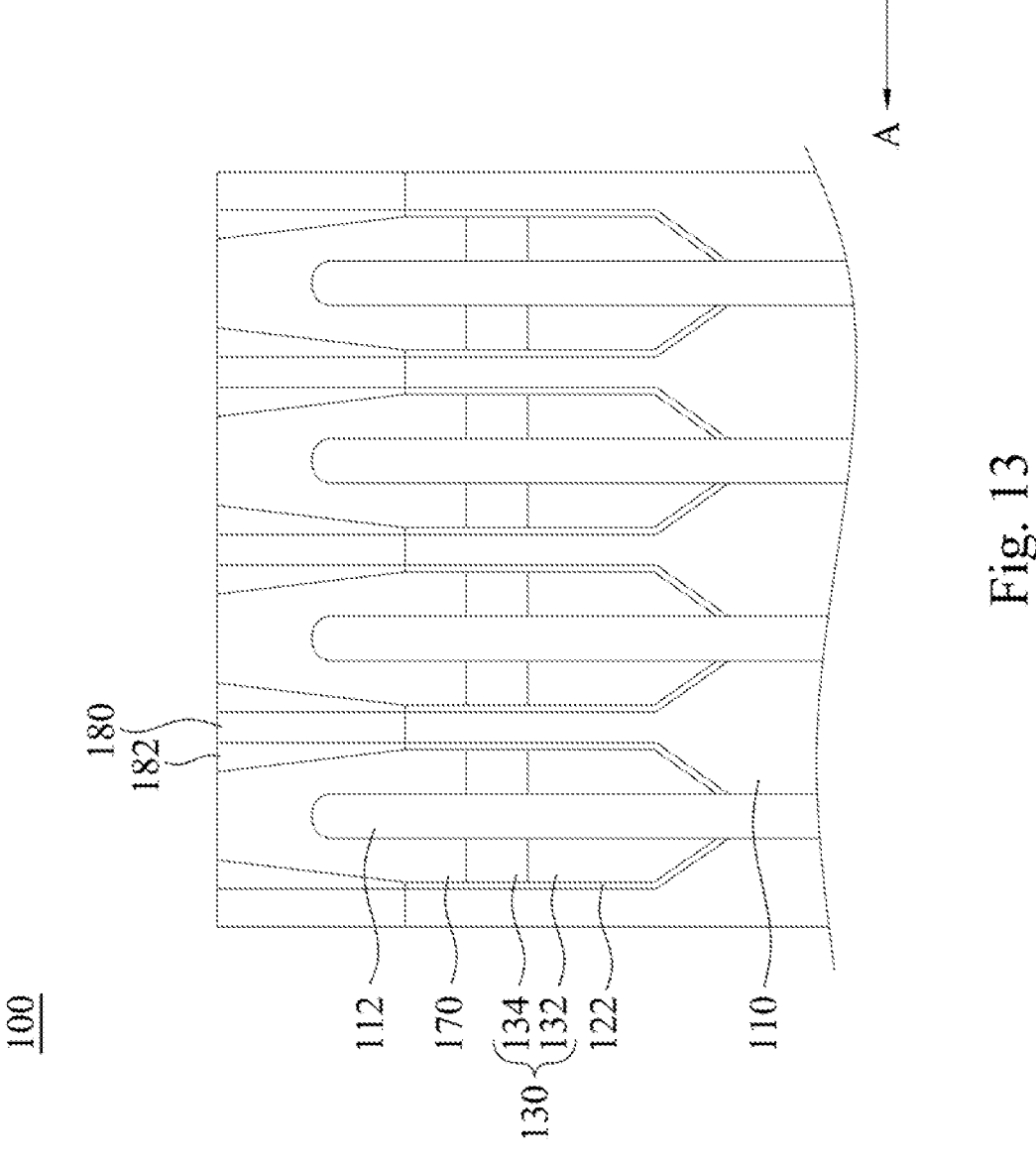
FIGS. 13-14 illustrate a cross section view of the manufacturing process of the semiconductor device.
Figure 14:
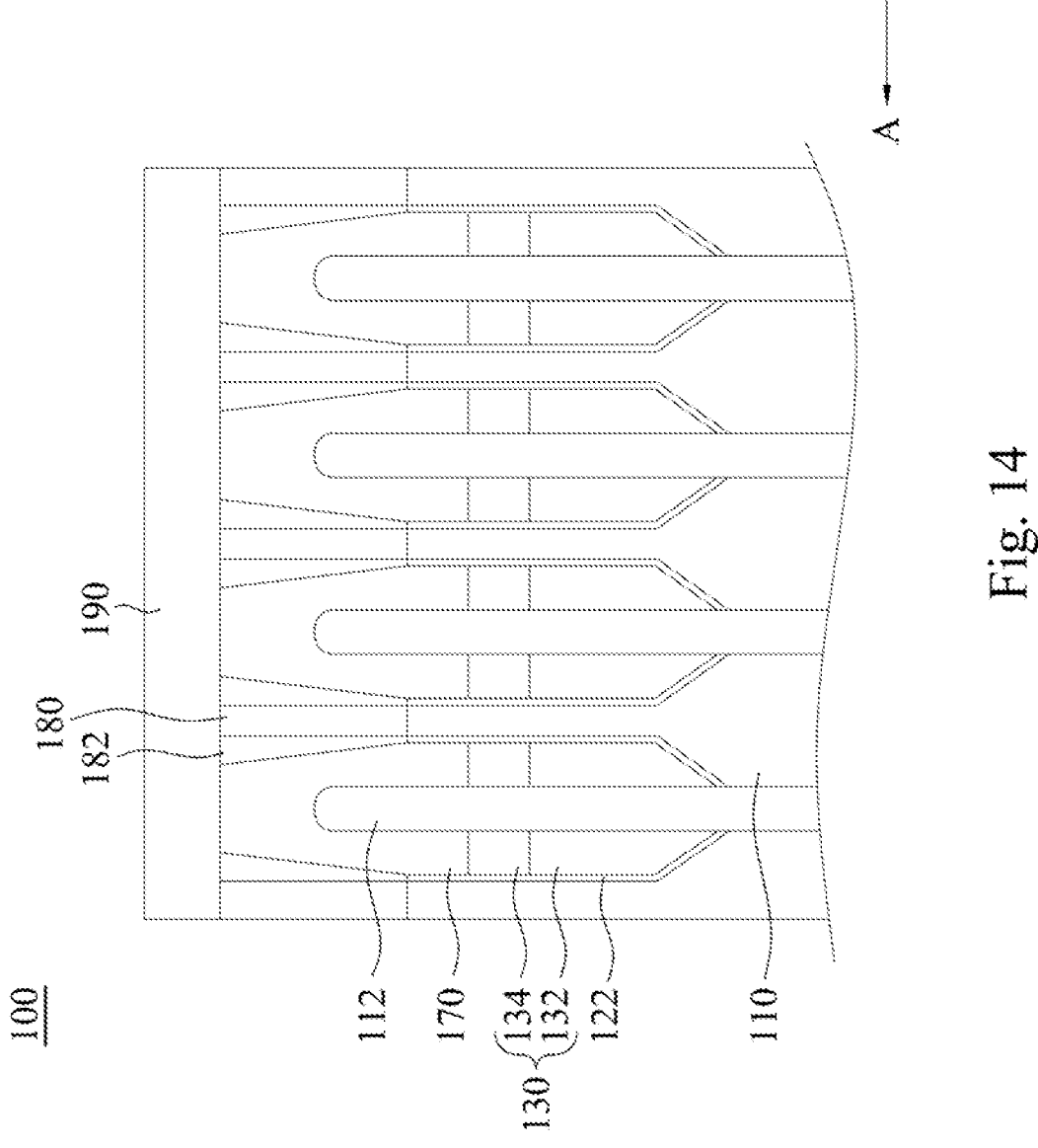

After forming the protection pillars 170, the bitline contacts 180 and the bitlines 190 are subsequently formed. FIGS. 13-14 illustrate a cross section view of the manufacturing process of the semiconductor device 100. Referring to FIG. 13, the bitline contacts 180 are formed on the active areas 110 after forming the protection pillars 170. In some embodiments, a dielectric layer is first formed to fill the space between the protection pillars 170. Subsequently, openings are formed in the dielectric layer to expose the active areas 110. Subsequently, the conductive materials are filled in the openings to form the bitline contacts 180 on the exposed surface of the active areas 110. The remaining dielectric layer becomes isolation structures 182 to provide the electrical isolation between the bitline contacts 180. The protection pillars 170 and the bitline contacts 180 are alternately arranged in direction A. Referring to FIG. 14, the bitlines 190 are formed on the bitline contacts 180. The location of the bitlines 190 is illustrated in FIG. 1. The bitlines 190 are formed on the active areas 110 and the protection pillars 170 along the direction A. That is, the direction of the bitlines 190 and the word lines 130 are perpendicular.

As mentioned above, the protection pillars of the semiconductor device are formed by using the first photolithography process and the second photolithography process. The parameters of the shape of the protection pillars 170 may be individually tuned in the first photolithography process and the second photolithography process, and the local critical dimension uniformity (CDU) problem of the protection pillars may be reduced. Therefore, the first portion 114, which may be easily etched in subsequent processes, of the active area 110 are well-protected by the protection pillars 170.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A manufacturing method of a semiconductor device, comprising:

providing a word line structure and a hard mask stack on the word line structure, wherein the word line structure comprises an active area, a word line, an isolation structure and a protection layer, the word line is adjacent to the active area and covers a first portion of the active area, the isolation structure is adjacent to the active area and the word line, and the protection layer covers the active area, the word line, and the isolation structure;

performing a first photolithography process to etch the hard mask stack by using a first photomask, wherein the first photomask is along a first direction;

performing a second photolithography process to etch the hard mask stack by using a second photomask, wherein the second photomask is along a second direction, and the second direction is different from the first direction; and forming a protection pillar covering the word line and the first portion of the active area by etching the protection layer by using the hard mask stack as a mask, wherein the first photolithography process defines a first sidewall and a second sidewall of the protection pillar, the second photolithography process defines a third sidewall and a fourth sidewall of the protection pillar, the first sidewall is opposite to the second sidewall, the third sidewall is opposite to the fourth sidewall, and the third sidewall is adjacent to the first sidewall.

2. The manufacturing method of claim 1, wherein an angle between the first direction and the second direction is between 30 degrees and 60 degrees.

3. The manufacturing method of claim 1, wherein the protection pillar is rhombus-shaped.

4. The manufacturing method of claim 1, wherein performing the first photolithography process comprises:

forming a first patterned photoresist layer on the hard mask stack by using the first photomask;

forming first spacers at sidewalls of the first patterned photoresist layer;

removing the first patterned photoresist layer; and etching the hard mask stack by using the first spacers.

5. The manufacturing method of claim 4, wherein forming the first spacers at the sidewalls of the first patterned photoresist layer comprises:

forming a first blanket layer covering the first patterned photoresist layer and the hard mask stack; and partially etching the first blanket layer to remove the first blanket layer directly on the first patterned photoresist layer and the hard mask stack, wherein the first blanket layer at the sidewalls of the first patterned photoresist layer remains and become the first spacers.

6. The manufacturing method of claim 4, wherein performing the first photolithography process comprises controlling a width of the first spacers.

7. The manufacturing method of claim 4, wherein the first patterned photoresist layer is etched and trimmed after forming a first patterned photoresist layer on the hard mask stack.

8. The manufacturing method of claim 1, wherein performing the second photolithography process comprises:

forming a second patterned photoresist layer on the hard mask stack by using the second photomask;

forming second spacers at sidewalls of the second patterned photoresist layer;

removing the second patterned photoresist layer; and etching the hard mask stack by using the second spacers.

9. The manufacturing method of claim 8, wherein forming the second spacers at the sidewalls of the second patterned photoresist layer comprises:

forming a second blanket layer covering the second patterned photoresist layer and the hard mask stack; and partially etching the second blanket layer to remove the second blanket layer directly on the second patterned photoresist layer and the hard mask stack, wherein the second blanket layer at the sidewalls of the second patterned photoresist layer remain and become the second spacers.

10. The manufacturing method of claim 8, wherein performing a second photolithography process comprises controlling a width of the second spacers.

11. The manufacturing method of claim 8, wherein the protection pillar further covers isolation structure.

12. A manufacturing method of a semiconductor device, comprising:

providing a word line structure and a hard mask stack on the word line structure, wherein the word line structure comprises active areas, word lines, isolation structures and a protection layer, each of the active areas is sandwiched by the word lines, a first portion of each of the active areas is covered by the word lines, each of the isolation structures is sandwiched by the word lines, and the protection layer covers the active areas, the word lines, and the isolation structures;

performing a first photolithography process to etch the hard mask stack by using a first photomask, wherein the first photomask is along a first direction;

performing a second photolithography process to etch the hard mask stack by using a second photomask, wherein the second photomask is along a second direction, and the second direction is different from the first direction; and forming protection pillars covering the word lines and the isolation structures by etching the protection layer by using the hard mask stack as a mask, wherein the protection pillars cover the first portion of each of the active areas, and a second portion of each of the active areas is exposed, wherein the first photolithography process defines a first sidewall and a second sidewall of each of the protection pillars, the second photolithography process defines a third sidewall and a fourth sidewall of each of the protection pillars, the first sidewall is opposite to the second sidewall, the third sidewall is opposite to the fourth sidewall, and the third sidewall is adjacent to the first sidewall.

13. The manufacturing method of claim 12, wherein each of the protection pillars extends from one of the word lines to another of the word lines.

14. The manufacturing method of claim 12, further comprising:

forming bitline contacts on the active areas after forming the protection pillars; and forming bitlines on the bitline contacts.

* * * * *